US006191715B1

(12) United States Patent
Fowers

(10) Patent No.: US 6,191,715 B1
(45) Date of Patent: Feb. 20, 2001

(54) SYSTEM FOR CALIBRATION OF A DIGITAL-TO-ANALOG CONVERTER

(75) Inventor: Paul Fowers, Tucson, AZ (US)

(73) Assignee: Burr-Brown Corporation, Tucson, AZ (US)

(*) Notice: Under 35 U.S.C. 154(b), the term of this patent shall be extended for 0 days.

(21) Appl. No.: 09/182,815

(22) Filed: Oct. 29, 1998

(51) Int. Cl.[7] .................................................. H03M 1/10
(52) U.S. Cl. ........................................... 341/120; 341/143
(58) Field of Search .................................. 341/120, 143, 341/144, 155

(56) References Cited

U.S. PATENT DOCUMENTS

| 3,827,047 | 7/1974 | Kasakowski et al. | 340/347 |
|---|---|---|---|
| 4,272,760 | 6/1981 | Prazak et al. | 340/347 |
| 4,340,882 | 7/1982 | Maio et al. | 340/347 |
| 4,591,828 | 5/1986 | Storey | 340/347 |
| 4,829,236 | 5/1989 | Brenardi et al. | 324/73 |
| 4,970,515 | 11/1990 | Draxelmayr | 341/120 |
| 4,999,633 | 3/1991 | Draxelmayr | 341/120 |
| 5,012,241 | 4/1991 | Kuttner | 341/120 |
| 5,053,770 | 10/1991 | Mayer et al. | 341/118 |
| 5,087,914 | 2/1992 | Sooch et al. | 341/120 |
| 5,144,308 | * 9/1992 | Norsworthy | 341/143 |
| 5,172,115 | 12/1992 | Kerth et al. | 341/120 |
| 5,248,970 | 9/1993 | Sooch et al. | 341/120 |
| 5,305,004 | 4/1994 | Fattaruso | 341/120 |
| 5,381,148 | 1/1995 | Mueck et al. | 341/139 |
| 5,583,501 | 12/1996 | Henrion et al. | 341/118 |

OTHER PUBLICATIONS

"Correcting Errors Digitally in Data Acquisition and Control" by Paul Prazak and Andrij Mrozowski, Electronics, Nov. 22, 1997, pp. 123–128.

"A 17-Bit Oversampling D-to-A Conversion Technology Using Multistage Noise Shaping" by Matsuya et al., IEEE Journal of Solid-State Circuits, vol. 24, No. 4, Aug. 1989, pp. 969–975.

* cited by examiner

Primary Examiner—Michael Tokar
Assistant Examiner—Peguy Jean Pierre
(74) Attorney, Agent, or Firm—Cahill, Sutton & Thomas P.L.C.

(57) ABSTRACT

A self-calibrating digital-to-analog converter includes a delta-sigma modulator (25) receiving a digital input signal, an output producing a stream of digital pulses the density of which represents a value of the digital input signal, and an intermediate digital input port coupled to a digital summing element which is also coupled to an output of an integrator within the delta-sigma modulator. A 1-bit DAC converts the stream of digital pulses to an analog signal that is filtered to produce an analog output voltage. A 1-bit DAC converts the analog output signal to a digital feedback signal, and a successive approximation circuit produces a digital offset correction signal from the digital feedback signal and loads it into an offset register. An output port of the offset register is coupled to the intermediate digital input port to provide self-calibration of an offset error without skewing an input range of the digital input signal. The filter circuit includes an operational amplifier and switching circuitry operative to isolate the analog output voltage from both the inverting input and the output of the operational amplifier during the self-calibration operation of the self-calibrating digital-to-analog converter.

24 Claims, 3 Drawing Sheets

SYSTEM FOR CALIBRATION OF A DIGITAL-TO-ANALOG CONVERTER

BACKGROUND OF THE INVENTION

The invention relates to a self-calibrating digital-to-analog converter that requires a less limited range of its digital input signal to avoid distortion of its analog output than is the case for prior self-calibrating digital-to-analog converters. The invention also relates to such a self-calibrating digital-to-analog converter which does not skew its valid digital input range as a result of digital self-calibration to accomplish an offset correction, or as a result of switching from a self-calibrating mode to a normal operating mode.

U.S. Pat. No. 5,087,914 (Sooch et al) discloses the closest prior art presently known to the inventor. FIG. 1 of U.S. Pat. No. 5,087,914 shows a digital-to-analog conversion system in which a digital input 18 is converted to an analog output on conductor 34. The system includes a digital section 10 that performs two main functions, the first of which is to convert an 18-bit digital input word on bus 18 to a 1-bit digital data stream that appears on a single conductor 20. It accomplishes this mainly by an oversampling system that includes an interpolation filter and sample/hold circuitry in block 14, and applies that information in parallel form to the digital inputs of a delta-sigma modulator 16. Delta-sigma modulator 16 functions as a "quantizer" that converts the parallel digital data input to it into a 1-bit digital data stream containing essentially the same digital information.

The second function performed by digital section 10 of U.S. Pat. No. 5,087,914 is to perform a digital self-calibration to adjust for an analog "offset" voltage that, because of inaccuracies in the circuit components, would otherwise appear on analog output conductor 34 if all eighteen bits of the digital input on BUS 18 were set to logical "0"s. To accomplish the self-calibration, the system of U.S. Pat. No. 5,087,914 converts the analog offset voltage to a digital number which is stored in offset register 19 and then is added by means of adder 24 to the digital output produced by the interpolation filter and sample/hold circuitry 14. The addition of adder 24 is performed before or ahead of the delta-sigma modulator 16. The digital offset correction provides a more accurate parallel data input to delta-sigma modulator 16. Therefore, any digital input word applied to input conductors 18 will be converted to an accurate analog output voltage, with the offset error having been cancelled by offset register 26 and parallel adder 24.

Analog section 12 of U.S. Pat. No. 5,087,914 includes a 1-bit digital-to-analog converter 21 followed by an analog filter 22 and an output operational amplifier 28. During a self-calibration operation, operational amplifier 28 amplifies the output of analog filter 22 and feeds it back via a comparator 28 to a calibration control circuit 40 which computes an offset value by a successive approximation technique and loads it into offset register 26. Meanwhile, isolation operational amplifier 28 isolates the analog output 34 from the output of output operational amplifier 28 during the entire self-calibration procedure and also closes switch 44 to thereby clamp analog output 34 to ground.

A problem with performing the self-calibration ahead of the delta-sigma modulator as disclosed in U.S. Pat. No. 5,087,914 is that adding a digital offset correction number to the digital input word before it is applied as an input to the delta-sigma modulator skews the valid digital input signal range of the delta-sigma modulator by the amount of the digital offset correction. That can result in "clipping" of digital bits within the delta-sigma modulator at the end of the input signal range which is diminished by the amount of the digital offset correction. That makes it necessary to add one or more bits to the length of the digital input word if it is desired to avoid distortion of the analog output of the digital-to-analog converter that is caused by diminishing one end of the valid digital input range by the amount of the digital offset correction. Thus, the self-calibration technique described in U.S. Pat. No. 5,087,914 either diminishes the digital input range or requires addition of one or more bits to the length of the digital input word; the latter increases the complexity and amount of chip area required for an integrated circuit implementation of the digital-to-analog converter 1.

Another problem of the self-calibration scheme disclosed in U.S. Pat. No. 5,087,914 is that the analog output terminal is clamped to the ground reference voltage level by switch 44 during each self-calibration operation. That ground level may be an "invalid" level with respect to an external utilization system that receives the output signal of the digital-to-analog converter, and therefore may be very undesirable in the utilization system because it may necessitate disabling the entire utilization system during self-calibration of the digital-to-analog converter of the '914 patent. In any case, additional time then must be allowed for the utilization system to recover when the analog output on conductor 34 is unclamped after the self-calibration procedure is complete. Thus, there is a need for a self-calibrated digital-to-analog converter which does not limit the digital input range or clamp the output during the self-calibration operation.

Another problem with the self-calibration scheme disclosed in U.S. Pat. No. 5,087,914 is that since the feedback resistor 36 is clamped to ground during the self-calibration operation, it can not also be used to establish the gain of amplifier 28 during self-calibration. Therefore, the system disclosed in U.S. Pat. No. 5,087,914 would not be expected to provide self-calibration of the gain of the digital-to-analog converter.

SUMMARY OF THE INVENTION

Accordingly, it is an object of the invention to provide a self-calibration circuit and method for a digital-to-analog converter which does not isolate the analog output terminal from an output operational amplifier during digital self-calibration.

It is another object of the invention to avoid a slow recovery time of an analog output during self-calibration of an digital-to-analog converter.

It is another object of the invention to avoid skewing of the valid digital input signal range of a delta-sigma modulator of a delta-sigma digital-to-analog converter digital input signal as a result of digital self-calibration to eliminate the effects of an offset error.

It is another object of the invention to provide a self-calibration system for a digital-to-analog converter to avoid loss of bits of resolution as a result of a digital self-calibration operation.

It is another object of the invention to avoid "clipping" and consequent distortion of the analog output of a digital-to-analog converter as a result of skewing of the valid range of the digital input signal of a delta-sigma modulator caused by digital self-calibration ahead of the delta-sigma modulator.

It is another object of the invention to provide a self-calibration system for a digital-to-analog converter which accommodates addition of dither and/or self-calibration of offset without causing distortion of the analog output of the digital-to-analog converter.

It is another object of the invention to provide a self-calibration system for a digital-to-analog converter which avoids distortion due to substantial load changes that occur during a self-calibration operation.

It is another object of the invention to provide a self-calibrated digital-to-analog converter which has minimum effect on the analog output signal during a self-calibration operation.

It is another object of the invention to provide a self-calibration system for a digital-to-analog converter which avoids the need for an analog output thereof to recover from being clamped to a reference voltage during a self-calibration procedure.

It is another object of the invention to provide a self-calibration system for a digital-to-analog converter which also accepts an external digital offset value and avoids skewing of the valid digital input signal range of a delta-sigma modulator thereof if the external digital offset value is less than a predetermined value.

It is another object of the invention to provide a delta-sigma digital-to-analog converter the analog output of which settles rapidly from a large transition caused by a large digital input step between successive digital inputs.

Briefly described, and in accordance with one embodiment thereof, the invention provides a self-calibrating digital-to-analog converter for converting a digital input signal (10) to an analog output voltage ($V_{OUT}$) without either skewing the digital input range by the amount of a digital offset correction, or grounding or otherwise clamping the analog output signal during the self-calibration operation. The self-calibrating digital-to-analog converter includes a delta-sigma modulator (25) having a first digital input (21) receiving a digital representation of the digital input signal (10), an output producing a stream of digital pulses the density of which represents a value of the digital input signal (10), and an intermediate digital input port (22) coupled to a digital summing element (73) which is also coupled to an output of an integrator (72) within the delta-sigma modulator. A 1-bit DAC (27) is coupled to the output (26) of the delta-sigma modulator for converting the stream of digital pulses to a first analog signal (28). A filter circuit (29,35) is coupled to filter the first analog signal (28) to produce an analog output voltage ($V_{OUT}$). A 1-bit analog-to-digital converter (61,65) is coupled to convert the analog output signal (28) to produce a digital feedback signal (66), and a successive approximation control circuit (67) produces a digital offset correction signal (68) in response to the digital feedback signal. The digital offset correction signal is stored in an offset register (19B) having an output port coupled to the intermediate digital input port (22) of the delta-sigma modulator. The filter circuit includes an operational amplifier (41) having an input coupled to receive a portion of the first analog signal (28) that is pre-filtered by a switched capacitor filter (29), the operational amplifier also having an output producing the analog output voltage ($V_{OUT}$), and switching circuitry (46,56,57) operative to isolate the output (55) on which the analog output voltage is produced from the output of the operational amplifier during the self-calibration operation of the self-calibrating digital-to-analog converter. A sample and hold circuit (46,48,49,50) operates to sample the analog output voltage ($V_{OUT}$) prior to beginning of the self-calibration operation and to hold the analog output voltage ($V_{OUT}$) during the self-calibration operation. In one embodiment an offset register includes (1) an LSB portion coupled to the successive approximation control circuit (67) for storing the digital offset correction signal and having an output port coupled to the intermediate digital input port (22) of the delta-sigma modulator, to provide self-calibration of an offset error of the self-calibrated digital-to-analog converter without skewing an input range of the digital input signal, and (2) an MSB portion (19A) coupled to one input of a digital adder (17) interposed between the first digital input and a digital input port of the digital-to-analog converter (1) and an external offset input (20) coupled to inputs of both the MSB (19A) and LSB (19B) portions of the offset register. In another embodiment, a large step between successive digital inputs is detected and a capacitance that limits the bandwidth of the filter circuit is temporarily disconnected from the filter circuit, increasing the bandwidth of the filter circuit and providing fast settling of a large transition of the analog output voltage caused by the large step.

DETAILED DESCRIPTION OF THE PREFERRED EMBODIMENTS

Figure 1:
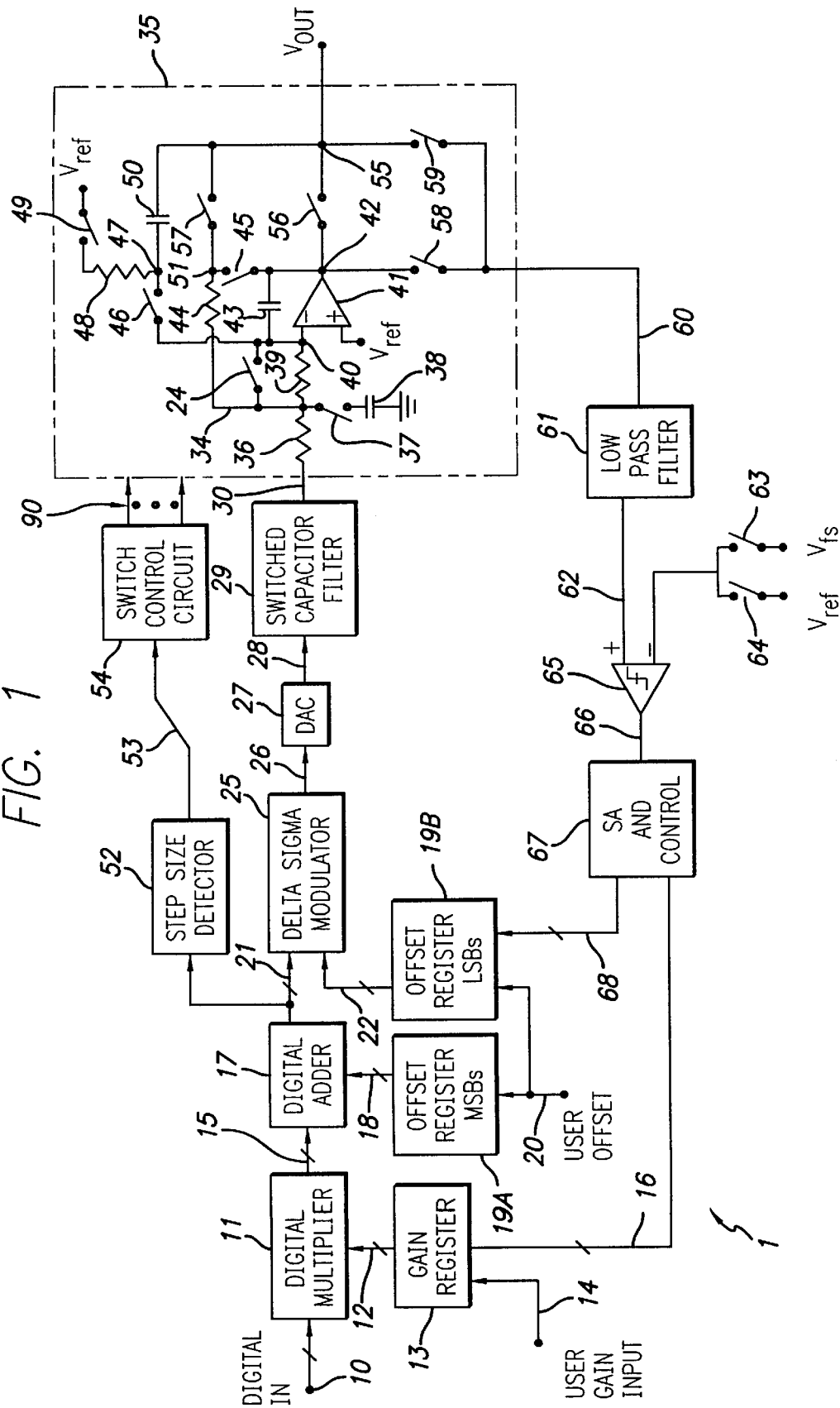
FIG. 1 is a block diagram of a digital-to-analog converter of the present invention.

Enclosed FIG. 1 shows the pertinent details of the present digital-to-analog converter 1 and its calibration system. Digital-to-analog converter 1 includes an input bus 10 which receives a digital input word DIGITAL IN and applies it to one set of inputs of a digital multiplier 11. (In FIG. 1, the slashes shown on the data paths indicate multi-conductor busses.) A second set of inputs of digital multiplier 11 receives a digital gain adjustment word on conductors 12 from a gain register 13, the contents of which are received in parallel format either via a conductors 16 from a successive approximation and control circuit 67 or from a conductors 14 which conducts a serial digital signal USER GAIN INPUT.

Figure 2:
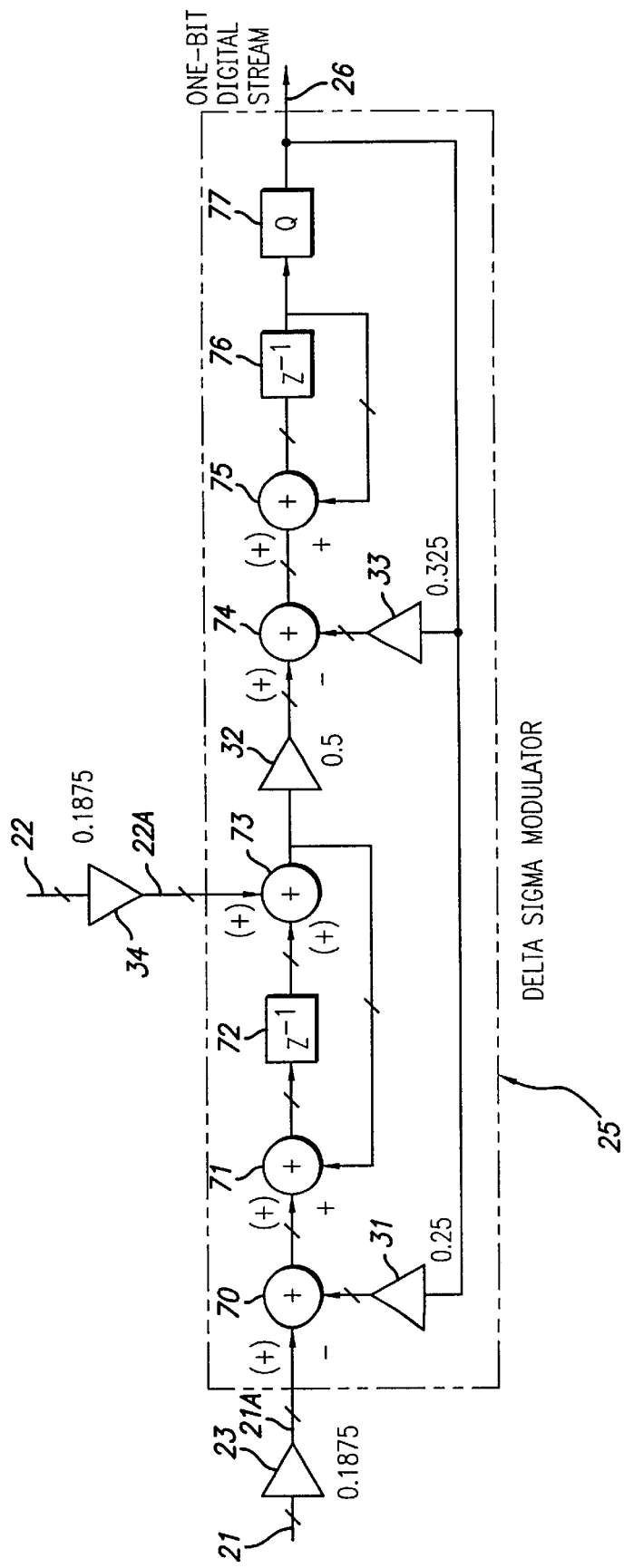
FIG. 2 is a schematic diagram of a digital delta-sigma modulator included in FIG. 1.

The outputs of digital multiplier 11 are connected by corresponding conductors 15 to one set of inputs of a digital adder 17, which has a second set of digital inputs connected by conductors 18 to the corresponding outputs of an MSB offset register 19A. The outputs of digital adder 17 are connected by conductors 21 to corresponding inputs of a digitally implemented delta-sigma modulator 25, the details of which are shown in FIG. 2. A single output conductor 26 of delta-sigma modulator 25 is connected to the input of a 1-bit DAC (digital-to-analog converter) 27. The output of 1-bit DAC 27 is connected by a conductor 28 to an input of a switched capacitor filter circuit 29, the output of which is connected to conductor 30. (The details of several implementations of switched capacitor filter 29 are shown in my co-pending, commonly assigned application, Ser. No. 09/074,279, filed May 7, 1998 and entitled "METHOD AND CIRCUIT FOR COMPENSATING THE NON-LINEARITY OF CAPACITORS", incorporated herein by reference.)

Conductor 30 is connected to the input of a continuous time (CT) filter circuit 35, which includes an input resistor 36 (which may have a resistance of about 70 kilohms) having one terminal connected to conductor 30 and a second conductor connected by conductor 34 to one terminal of a switch 37, one terminal of a resistor 39 (which may have a resistance of about 200 k ohms), and one terminal of a resistor 44 (which may have a resistance of about 140 k ohms. A second terminal of resistor 39 is connected by a conductor 40 to the (−) input of an operational amplifier 41, one plate of a feedback capacitor 43 (which may have a capacitance of about 100 picofarads), and one terminal of a switch 46. A switch 24 is connected between conductors 34 and 40. A (+) input of operational amplifier 41 is connected to a reference voltage $V_{ref}$.

A second terminal of switch 37 is coupled by a capacitor 38 to ground. A second plate of capacitor 43 is connected by conductor 42 to the output of operational amplifier 41, one terminal of a switch 56, one terminal of a switch 45, and one terminal of a switch 58. A second terminal of switch 46 is connected by a conductor 47 to one terminal of a resistor 48 (which may have a resistance of about 400 ohms) and one plate of a capacitor 50 (which may have a capacitance of about 1000 picofarads). A second terminal of resistor 48 is connected by a switch 49 to the reference voltage $V_{ref}$. A second terminal of switch 56 is connected by conductor 55 to a second plate of capacitor 50, a second terminal of switch 57, and to a first terminal of a switch 59. An analog output voltage $V_{OUT}$ that represents the digital input signal DIGITAL IN is produced on conductor 55. A second terminal of each of switches 58 and 59 is connected by a conductor 60 to an input of a low pass filter 61.

The various switches in CT filter circuit 35 are controlled by signals on conductors 90 which are produced by a switch control circuit 54. Switch control circuit 54 controls switches 37, 46, 49, and 56 in response to a step size indicating signal 53 produced by a step size detector circuit 52. Step size detector circuit 52 produces the signal on conductor 53 by measuring and comparing the most recent digital word on conductors 21 with the previous digital word thereon to determine how large a change in the digital input signal is to be processed by delta-sigma modulator 25. If the digital step size exceeds a predetermined value, switch control circuit 54 isolates capacitors 38 and 50 by appropriately opening switches 36 and 46 and closing switches 49 and 56. This effectively converts CT filter 35 from a second order filter to a faster-settling first order filter, and allows the digital-to-analog converter 1 of FIG. 1 to respond faster to large changes in the digital signal DIGITAL IN. (Step size detection circuit 52 can be easily implemented by circuitry which performs a digital subtraction of the two digital inputs followed by a comparison, to determine if the step size exceeds a predetermined level.)

Figure 3:
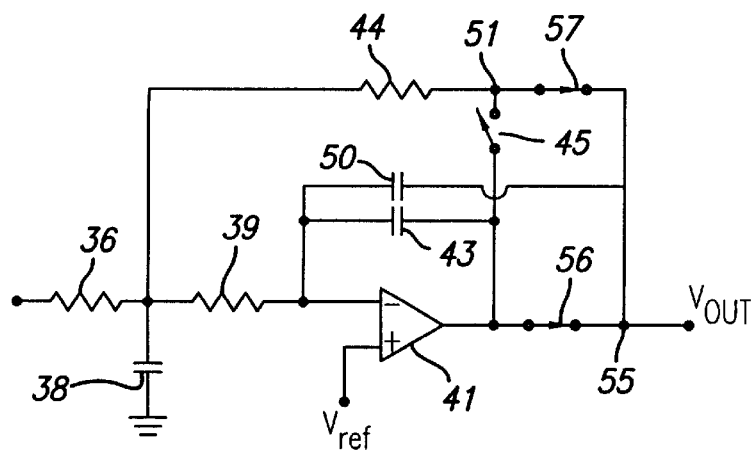
FIG. 3 is an equivalent circuit representing the configuration of the switched capacitor filter circuit 35 of FIG. 1 during normal digital-to-analog conversion operations.

FIG. 3 shows the configuration of an equivalent circuit for CT Filter 35 during normal digital-to-analog conversion, during which it is configured as the above mentioned second order filter.

Figure 4:
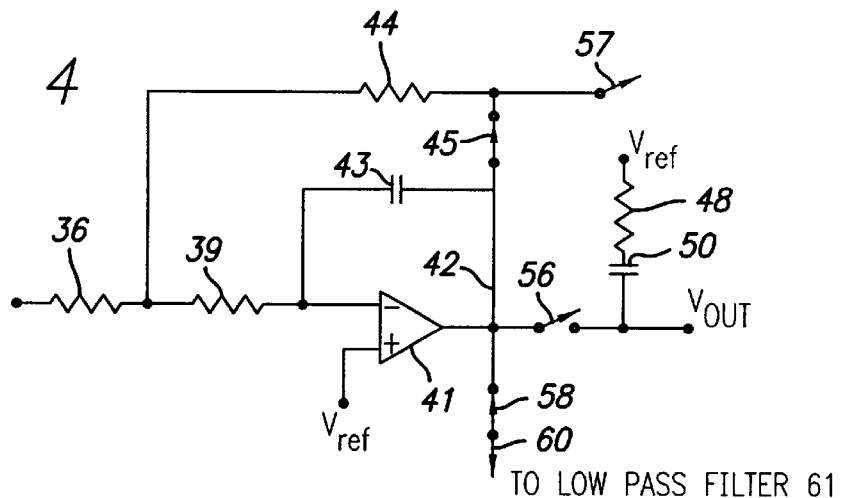
FIG. 4 is an equivalent circuit diagram of the configuration of switched capacitor filter 35 of FIG. 1 during one of two possible self-calibration modes.

FIG. 4 shows CT filter 35 as configured during self-calibration, while capacitors 38 and 50 are disconnected from the filter and capacitor 50 is used as a sample/hold capacitor. If switch 56 is closed, this provides a first order filter configuration that increases the bandwidth and thereby provides a fast settling mode for CT filter 35; this is desirable if the present digital input applied to delta-sigma modulator 25 represents an overly large step from the value of the previous digital input applied thereto. Opening or closing switch 24 of FIG. 1 provides an alternative way of adjusting the bandwidth of CT filter 4, without necessarily disconnecting or connecting capacitor 50 or capacitor 38.

An output of low pass filter 61 is connected by conductor 62 to one input (+) of a comparator 65. The other input of comparator 65 is connected to a first terminal of each of switches 63 and 64. The second terminal of switch 63 is connected to a gain reference voltage $V_{fs}$, and the second terminal of switch 64 is connected to an offset voltage $V_{ref}$. The output of comparator 66 is connected to the input of a successive approximation and control circuit 67. Digital-to-analog converter 1 can be powered by a 5 volt power supply, $V_{ref}$ can be 2–3 volts, and $V_{fs}$ can be close to 0 volts.

Thus, the signal DIGITAL IN is multiplied by a digital gain number stored in gain register 13. The resulting digital signal on conductors 15 is added to any digital offset correction number that may be stored in MSB offset register 19A by means of digital adder 17. Typically, a second set of inputs applied to digital adder 17 via conductors 18 all will be "zeros" during self-calibration. Therefore, the output of digital multiplier 11 ordinarily will be "passed through" digital adder 17 and applied as the main digital input of delta-sigma modulator 25.

Referring to FIG. 2, digital delta-sigma modulator 25 includes a digital adder 70 having a set of (+) inputs connected to corresponding conductors 21A. The conductors 21 (FIG. 1) are connected to inputs of a digital gain stage 23 that provides a digital gain of 0.1875, typically by binary bit shifting or other known digital gain scaling techniques. Digital adder 70 also includes a set of (−) inputs that receive parallel bits that first are present on the output conductor 26 of delta-sigma modulator 25 and then input to and multiplied by a digital gain stage 31 having a gain of 0.25. The digital output of adder 70 is connected to a set of (+) inputs of a digital adder 71. Digital adder 71 has a set of (+) inputs connected to the outputs of another digital adder 73. The parallel output of digital adder 71 is applied to the parallel input of an integrator 72 which can be implemented by means of an n-bit clocked register. The parallel outputs of integrator 72 are applied to (+) inputs of a digital adder 73. One set of (+) inputs of digital adder 73 receive a digital correction number from the LSB offset register 19B via conductors 22 and a digital gain stage 34 that multiplies the digital offset correction number on conductors 22 by 0.1875 to produce a corresponding digital number that is applied by conductors 22A to another set of (+) inputs of adder 73.

The outputs of digital adder 73 are supplied to a digital gain stage 32 having a gain of 0.5 and then are applied to the (+) inputs of digital adder 74. One set of (+) inputs of digital adder 74 is connected to receive the 1-bit digital output produced on conductor 26 of delta-sigma modulator 25 after it is converted to parallel format and multiplied by a gain of 0.325 by digital gain stage 33. The parallel outputs of digital adder 74 are connected to the (+) input of digital adder 75, which has another set of (+) inputs connected to the output of digital integrator 76; integrator 76 also can be implemented by an n-bit clocked register. The parallel inputs of integrator 76 are connected to the parallel outputs of digital adder 75. The parallel outputs of integrator 76 also are connected to the inputs of a quantizer 77, the one-bit output of which is connected to conductor 26. Delta-sigma modulator 25 produces a serial digital stream of bits on conductor 26 wherein the "density" of "1"s in the serial digital stream represents the value of the digital input signal received from the output of digital adder 17, internally adjusted within delta-sigma modulator 25 for any digital offset number applied via conductors 22.

Referring to FIG. 1, a 1-bit DAC 27 converts the serial stream of digital bits on conductor 26 to an analog output on conductor 28, which then is applied to the input of switched capacitor filter 29. The output 30 of switched capacitor filter 29 is applied to the input of continuous time filter 35, which in response produces the analog voltage $V_{OUT}$ representing the signal DIGITAL IN. Continuous time filter 35 also produces an analog feedback signal on conductor 60, which feedback signal is filtered by low pass filter 61 and applied by conductor 62 to the input of comparator 65. Low pass filter 61 and comparator 65 act as a 1-bit analog-to-digital converter to convert either the voltage on conductor 47 or $V_{OUT}$ to a serial digital number. Comparator 65 produces a serial digital feedback signal on conductor 66 as an input to successive approximation and control circuit 67. Successive approximation and control circuit 67 produces a digital gain control number and loads it via conductors 16 into gain register 13. Successive approximation and control circuit 67 also produces a digital offset correction number and loads it via conductors 68 into LSB offset register 19B.

Using a successive approximation fashion similar to that described in U.S. Pat. No. 5,087,914 and the article "Correcting Errors Digitally in Data Acquisition and Control" by Prazak and Mrozowski, Electronics, Nov. 27, 1979, page 123 (incorporated herein by reference), the circuitry in block 67 computes both the digital offset number on conductors 68 required for self-calibration and the calibrated gain number on conductors 16 required for self-calibration. During the internal self-calibration operation, only the "feedback" digital offset from LSB offset register 19B is provided to the second input 22 of delta-sigma modulator 25.

Referring to FIG. 2, it can be seen that the digital self-calibration offset number on conductors 22 is applied to digital adder 73 located inside delta-sigma modulator 25, unlike U.S. Pat. No. 5,087,914 wherein the self-calibration feedback values from the calibration and control circuit 40 and offset register 3 in FIG. 1 of U.S. Pat. No. 5,087,914 are entered into a digital adder 68 that is located outside of the delta-sigma modulator 16.

The digital "user offset" input conductors 20 in FIG. 1 allow a user of a system which incorporates digital-to-analog converter 1 to provide externally generated "system offset" digital calibration numbers to be serially loaded via conductor 20 into both MSB and LSB offset registers 19A and 19B. In this case, no internally generated self-calibration number is loaded into LSB offset register 19B. Instead, the user-supplied digital offset data in MSB offset register 19A is supplied in parallel format as an input via conductors 18 to digital adder 17. Similarly, the user can provide external gain calibration data as a serial input via conductor 14 to gain register 13 instead of relying on the self-calibration gain data 16 produced by successive approximation and control circuit 67.

Thus, the digital offset correction self-calibration data 68 generated by successive approximation and control circuit 67 and loaded into LSB offset register 19B is not summed with the gain-adjusted digital data 15 ahead of delta-sigma modulator 25 as in U.S. Pat. No. 5,087,914, but instead is summed with intermediate digital data inside delta-sigma modulator 25 by means of conductors 22, gain stage 34, and internal digital adder 73 (FIG. 2).

The digital-to-analog converter 1 of FIG. 1 also differs from the one disclosed in U.S. Pat. No. 5,087,914 by providing an alternative "user offset" adjustment input signal on conductors 20, which can be generated in any way the user desires.

Continuous time filter 35 of the present invention operates entirely differently than the analog section 12 of U.S. Pat. No. 5,087,914. During normal digital-to-analog conversion operation, switches 57, 56, and 37 are closed, and therefore, the other switches are open. (One of switches 63 and 64 is closed, depending upon whether the self-calibration operation is presently producing offset calibration information 68 on the basis of $V_{ref}$ or gain calibration information 16 on the basis of the full scale reference voltage $V_{fs}$.) One of switches 58 or 59 is closed, depending upon whether the user wishes the offset calibration corrections to be based on the voltage $V_{OUT}$ on conductor 55 or on conductor 42 at the output of operational amplifier 41.

Thus, during normal operation, continuous time filter 35 acts as a normal filter, with both capacitors 43 and 50 and capacitor 38 connected in parallel as feedback capacitors. Either of voltages on conductors 42 or 55 can be selected as the feedback to low pass filter 61.

Referring to FIGS. 1, 3 and 4, during the self-calibration mode of digital-to-analog converter 1, switches 46, 59, and 37 are open, and switches 45, 56, 58, and 49 are closed. In the self-calibration mode, capacitor 50 is connected in series with a resistor 48 between output conductor 55 and $V_{REF}$ and capacitor 50, resistor 48, and output conductor 55 are isolated from operational amplifier 41. Resistor 48 and capacitor 50 then act as a sample and hold circuit for $V_{OUT}$. This is in sharp contrast to the approach in U.S. Pat. No. 5,087,914, in which the analog output voltage on conductor 55 just prior to beginning of self-calibration operation is clamped to ground, rather than sampled and held. The sample and hold circuitry of the present invention allows the analog output voltage at the end of the self-calibration procedure to have a value close to its previous value at the beginning of the self-calibration procedure. This usually would be very preferable to the utilization system because it would not have to recover from being clamped to ground during self-calibration.

It should be appreciated that a utilization system which includes digital-to-analog converter 1 could provide very different loading on conductor 55 during self-calibration operation than during normal digital-to-analog conversion operation. During normal digital-to-analog conversion operation, switch 45 is open and switch 57 is closed. During the self-calibration mode, in which the analog output conductor 55 and the load attached thereto are isolated from the output conductor 42 of operational amplifier 41, switch 57 is open and switch 45 is closed. Both switches 45 and 57 are implemented by means of field effect transistors or CMOS transmission gates.

It is important that the substantial on resistances of switches 45 and 57 be precisely matched so that each contributes equally to the feedback resistance including resistor 44 and hence each has the same effect on the gain of filter 35 (during both normal digital-to-analog conversion operation and during output-isolated self-calibration operation). Then, all offsets which occur within the feedback loop and all gain inaccuracies can be adjusted out of the analog output voltage $V_{OUT}$ accurately both for a 0 value of DIGITAL IN and a full-scale value thereof. This is in contrast to the structure shown in U.S. Pat. No. 5,087,914, in which the feedback resistor 36 is clamped to ground during the self-calibration procedure and hence can not be used to provide self-calibration of gain for the digital-to-analog converter of FIG. 1 of the '914 patent.

An advantage of the self-calibration circuitry included in CT filter 35 is that some of the same switches used for self-calibration operation also can be used to accomplish the previously described bandwidth adjusting operation during normal digital-to-analog conversion to accomplish fast recovery of the analog output voltage $V_{OUT}$ in response to an overly large step between successive digital input words.

Figure 5:
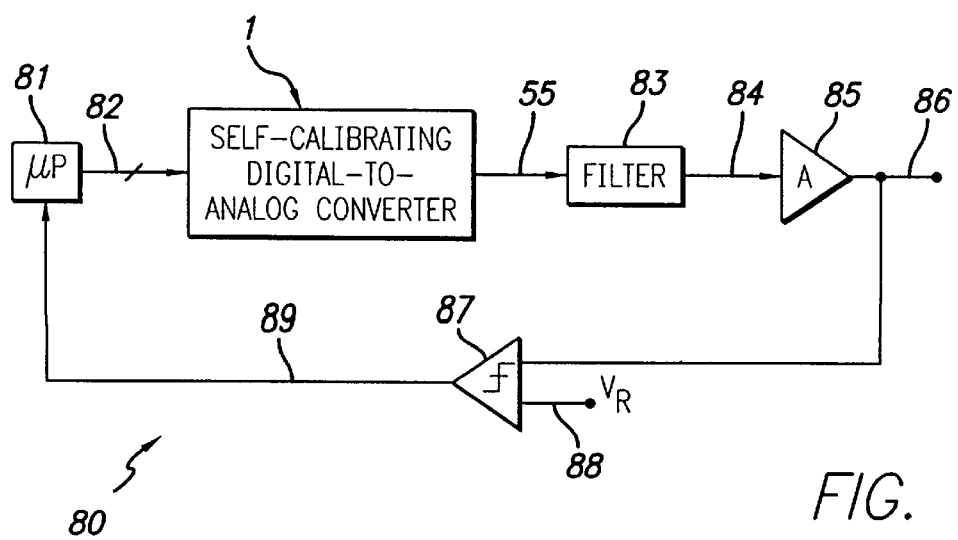
FIG. 5 is a block diagram of a utilization system which incorporates the self-calibrated digital-to-analog converter of the present invention.

As FIG. 5 shows, digital-to-analog converter 1 of FIG. 1 can have its various control inputs, including user gain input 14 and user offset input 20 and a clock input (not shown) included in a bus 82, the conductors of which are connected to a microprocessor or microcontroller 81. The analog output on analog conductor 55 of digital-to-analog converter 1 is connected to the input of additional filter circuitry 83, which could be implemented by analog or suitable digital filter circuitry. The output of filter circuitry 83 could be applied by conductor(s) 84 to analog or digital DC gain circuitry 85, which produces an output 86. The output 86 of the utilization system 80 is applied to a suitable comparator circuit 87 which compares the analog output 86 with a suitable reference signal 88 to produce an error signal 89. The error signal 89 is applied to a suitable input of microprocessor or microcontroller 81. Microcontroller 81 then generates the desired values of digital numbers to be serially input to gain register 13 or offset register 19A,B.

This configuration, including the configuration of digital-to-analog converter 1 of FIGS. 1 and 2, provides the user the full range of system offset calibration, even though the digital-to-analog converter 1 does not need to use the full range for offset self-calibration. The structure in which the user offset input applied by conductor 21 to both the LSB offset register 19B and the MSB offset register 19A makes the offset correction system completely "transparent" to the system 80. If the actual composite offset associated with digital-to-analog converter 1, filter circuitry 83, gain circuitry 85, and comparator 87 is smaller than the maximum value that can be stored in LSB offset register 19B, then the offset correction is applied to the intermediate input of delta-sigma modulator 25 via conductors 22 alone, and there is no skewing of the digital input range of the input word DIGITAL IN applied to the input of delta-sigma modulator 25. In this case, the utilization system 80 provides a full range of digital inputs values of DIGITAL IN with no "clipping" or distortion of corresponding analog output values of $V_{OUT}$. However, the utilization system 80 can calibrate digital-to-analog converter 1 for larger values of system offset than can be stored in LSB offset register 19B, the most significant bits of which automatically are loaded into MSB offset register 19A, although the distortion-free range of the signal DIGITAL IN will be correspondingly reduced.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, although FIGS. 1 and 2 illustrate processing of digital words in parallel format, the digital words could also be conducted in serial format (for slower implementations).

What is claimed is:

1. A self-calibrating digital-to-analog converter for converting a digital input signal to an analog output voltage, comprising:

(a) a delta-sigma modulator having a first digital input receiving a digital representation of the digital input signal, an output producing a stream of digital pulses the density of which represents a value of the digital input signal, and an intermediate digital input port coupled to a digital summing element which is located within an integrating loop of the delta-sigma modulator and is also coupled to an output of an integrator within the delta-sigma modulator;

(b) a serial digital-to-analog converter coupled to the output of the delta-sigma modulator for converting the stream of digital pulses to a first analog signal;

(c) a filter circuit coupled to filter the first analog signal to produce an analog output voltage;

(d) an analog-to-digital converter coupled to convert the analog output signal to produce a digital feedback signal;

(e) a successive approximation control circuit coupled to the analog-to-digital converter to produce a digital offset correction signal; and (f) an offset register coupled to the successive approximation control circuit for storing the digital offset correction signal and having an output port coupled to the intermediate digital input port of the delta-sigma modulator, to provide self-calibration of an offset error of the self-calibrated digital-to-analog converter without skewing an input range of the digital input signal.

2. The self-calibrating digital-to-analog converter of claim 1 wherein the filter circuit includes a continuous time filter circuit including i. an operational amplifier having an input coupled to receive a pre-filtered portion of the first analog signal, the operational amplifier also having an output producing the analog output voltage, and ii. switching circuitry operative to isolate the output on which the analog output voltage is produced from the output of the operational amplifier during the self-calibration operation of the self-calibrating digital-to-analog converter.

3. The self-calibrating digital-to-analog converter of claim 2 including a digital step size indicator circuit coupled to the input of the delta-sigma modulator to measure the difference between the two most recent digital numbers input to the delta-sigma modulator and produce a bandwidth adjustment signal, and a switch control circuit responsive to the bandwidth adjustment signal to temporarily open or close at least one switch to modify the bandwidth of the continuous time filter circuit to reduce a settling time of a transition of the analog output voltage produced in response to the most recent digital number.

4. The self-calibrating digital-to-analog converter of claim 2 including a digital step size indicator circuit coupled to the input of the delta-sigma modulator to measure the difference between the two most recent digital numbers input to the delta-sigma modulator and produce a bandwidth adjustment signal, and a switch control circuit responsive to the bandwidth adjustment signal to temporarily open at least one switch to disconnect a capacitance that limits the bandwidth of the continuous time filter circuit to reduce a settling time of a transition of the analog output voltage produced in response to the most recent digital number.

5. The self-calibrating digital-to-analog converter of claim 2 further including a sample and hold circuit operative to sample the analog output voltage prior to beginning of the self-calibration operation and to hold the analog output voltage during the self-calibration operation.

6. The self-calibrating digital-to-analog converter of claim 1 wherein the successive approximation control circuit produces a digital gain correction signal, the self-calibrating digital-to-analog converter including a gain register coupled to the successive approximation control circuit for receiving and storing the digital gain correction signal, an output of the gain register being coupled to one input of a digital multiplier having another input coupled to receive the digital input signal and an output coupled to the first digital input of the delta-sigma modulator.

7. The self-calibrating digital-to-analog converter of claim 6 wherein the gain register includes a user gain input to allow a digital user gain correction signal to be loaded into the gain register.

8. A self-calibrating digital-to-analog converter for converting a digital input signal to an analog output voltage, comprising:
(a) a delta-sigma modulator having a digital input port receiving a digital representation of the digital input signal, an output producing a stream of digital pulses the density of which represents a value of the digital input signal;
(b) a serial digital-to-analog converter coupled to the output of the delta-sigma modulator for converting the stream of digital pulses to a first analog signal;
(c) a filter circuit coupled to filter the first analog signal to produce an analog output voltage;
(d) an analog-to-digital converter coupled to convert the analog output signal to produce a digital feedback signal;
(e) a successive approximation control circuit coupled to the analog-to-digital converter to produce a digital offset correction signal;
(f) an offset register coupled to the successive approximation control circuit for storing the digital offset correction signal and having an output port coupled to the digital input port of the delta-sigma modulator, to provide self-calibration of an offset error of the self-calibrated digital-to-analog converter; and
the filter circuit including a continuous time filter circuit including
  i. an operational amplifier having an input coupled to receive a pre-filtered portion of the first analog signal, the operational amplifier also having an output producing the analog output voltage, and
  ii. switching circuitry operative to isolate an output terminal on which the analog output voltage is produced from the output of the operational amplifier during the self-calibration operation of the self-calibrating digital-to-analog converter and to couple the output terminal to the output of the operational amplifier during normal digital-to-analog conversion operation of the self-calibrating digital-to-analog converter.

9. The self-calibrating digital-to-analog converter of claim 8 wherein the switching circuitry includes a first switch operative to couple the output of the operational amplifier in series with a feedback resistor coupled to an input of the operational amplifier during the self-calibration operation, and a second switch operative to couple the output terminal in series with the feedback resistor during the normal digital-to-analog conversion operation.

10. The self-calibrating digital-to-analog converter of claim 9 further including a sample and hold circuit coupled to the output terminal and operative to sample the analog output voltage prior to beginning of the self-calibration operation and to hold the analog output voltage during the self-calibration operation.

11. The self-calibrating digital-to-analog converter of claim 10 wherein the first and second switches are both formed in one semiconductor chip and are precisely matched to have equal on resistances.

12. A self-calibrating digital-to-analog converter for converting a digital input signal to an analog output voltage, comprising:
(a) a delta-sigma modulator having a first digital input receiving a digital representation of the digital input signal, an output producing a stream of digital pulses the density of which represents a value of the digital input signal, and an intermediate digital input port coupled to a digital summing element which is also coupled to an output of an integrator within the delta-sigma modulator;
(b) a serial digital-to-analog converter coupled to the output of the delta-sigma modulator for converting the stream of digital pulses to a first analog signal;
(c) a filter circuit coupled to filter the first analog signal to produce an analog output voltage;
(d) an analog-to-digital converter coupled to convert the analog output signal to produce a digital feedback signal;
(e) a successive approximation control circuit coupled to the analog-to-digital converter to produce a digital offset correction signal;
(f) an offset register including an LSB portion coupled to the successive approximation control circuit for storing the digital offset correction signal and having an output port coupled to the intermediate digital input port of the delta-sigma modulator, to provide self-calibration of an offset error of the self-calibrated digital-to-analog converter without skewing an input range of the digital input signal and an MSB portion coupled to one input of a digital adder interposed between the first digital input and a digital input port of the digital-to-analog converter; and
(g) an external offset input coupled to inputs of both the MSB and LSB portions of the offset register.

13. The self-calibrating digital-to-analog converter of claim 12 wherein the successive approximation control circuit produces a digital gain correction signal, the self-calibrating digital-to-analog converter including a gain register coupled to the successive approximation control circuit for receiving and storing the digital gain correction signal, an output of the gain register being coupled to one input of a digital multiplier having another input coupled to receive the digital input signal and an output coupled by the digital adder to the first digital input of the delta-sigma modulator.

14. The self-calibrating digital-to-analog converter of claim 13 wherein the gain register includes a user gain input to allow a digital user gain correction signal to be loaded into the gain register.

15. A self-calibrating digital-to-analog converter for converting a digital input signal to an analog output voltage, comprising:
(a) a delta-sigma modulator having a first digital input receiving a digital representation of the digital input signal, an output producing a stream of digital pulses the density of which represents a value of the digital input signal, and an intermediate digital input port coupled to a digital summing element which is located within an integrating loop of the delta-sigma modulator and is also coupled to an output of an integrator within the delta-sigma modulator;

(b) circuitry coupled to the output of the delta-sigma modulator for converting the stream of digital pulses to an analog output voltage;

(c) an analog-to-digital converter coupled to convert the analog output signal to produce a digital feedback signal;

(d) a successive approximation control circuit coupled to the analog-to-digital converter to produce a digital offset correction signal; and (e) an offset register coupled to the successive approximation control circuit for storing the digital offset correction signal and having an output port coupled to the intermediate digital input port of the delta-sigma modulator, to provide self-calibration of an offset error of the self-calibrated digital-to-analog converter without skewing an input range of the digital input signal.

16. The self-calibrating digital-to-analog converter of claim 15 wherein the successive approximation control circuit produces a digital gain correction signal, the self-calibrating digital-to-analog converter including a gain register coupled to the successive approximation control circuit for receiving and storing the digital gain correction signal, an output of the gain register being coupled to one input of a digital multiplier having another input coupled to receive the digital input signal and an output coupled to the first digital input of the delta-sigma modulator.

17. The self-calibrating digital-to-analog converter of claim 16 wherein the gain register includes a user gain input to allow a digital user gain correction signal to be loaded into the gain register.

18. A method of self-calibrating a digital-to-analog converter to compensate an offset voltage of the digital-to-analog converter without skewing an input range of a digital input signal, comprising:

(a) providing (I) a delta-sigma modulator having a digital input receiving a digital representation of the digital input signal, an intermediate digital input port that is located within an integrating loop in the delta-sigma modulator, and an output, (ii) filter circuitry coupled to the output of the delta-sigma modulator for converting a stream of digital pulses thereon to an analog output voltage, (iii) an analog-to-digital converter coupled to convert the analog output voltage to produce a digital feedback signal, (iv) a successive approximation control circuit coupled to an output of the digital-to-analog converter, and (v) an offset register coupled to the successive approximation control circuit;

(b) operating the digital-to-analog converter to produce a value of the analog output voltage representing the offset voltage;

(c) operating the analog-to-digital converter and the successive approximation control circuit to convert the value to a digital offset number and storing the digital offset number in the offset register; and (d) applying the digital offset number to the intermediate digital input port during normal digital-to-analog conversion operation to compensate the offset.

19. The method of claim 18 including opening a switch coupled between an output conductor of the digital-to-analog converter and an output of the filter circuit during self-calibration to isolate the filter circuit from an external load coupled to the output conductor.

20. The method of claim 19 wherein the filter circuit determines a bandwidth of the filter circuit, the method including detecting a digital input step size between successive digital numbers input to the delta-sigma modulator and, if the digital input step size exceeds a predetermined value, modifying the bandwidth of the filter circuit for a predetermined period to increase the bandwidth of the filter circuit to allow fast settling thereof.

21. The method of claim 20 including modifying the bandwidth of the filter circuit by opening or closing a switch which is also used to isolate a portion of the filter circuit during steps (b)–(d).

22. The method of claim 19 wherein the filter circuit includes a capacitor which determines a bandwidth of the filter circuit, the method including detecting a digital input step size between successive digital numbers input to the delta-sigma modulator and, if the digital input step size exceeds a predetermined value, operatively decoupling the capacitor from the filter circuit for a predetermined period to increase the bandwidth of the filter circuit to allow fast settling thereof.

23. The method of claim 22 including operatively decoupling the capacitor from the filter circuit and storing the analog output voltage on the capacitor during self-calibration.

24. A digital-to-analog converter for converting a digital input signal to an analog output voltage, comprising:

(a) a delta-sigma modulator having a first digital input receiving a digital representation of the digital input signal, and an output producing a stream of digital pulses the density of which represents a value of the digital input signal;

(b) circuitry coupled to the output of the delta-sigma modulator for converting the stream of digital pulses to an analog output voltage;

(c) an analog-to-digital converter coupled to convert the analog output signal to produce a digital feedback signal;

(d) a successive approximation control circuit coupled to the analog-to-digital converter to produce a digital offset correction signal; and (e) a digital step size indicator circuit coupled to the input of the delta-sigma modulator to measure the difference between the two most recent digital numbers input to the delta-sigma modulator and produce a bandwidth adjustment signal, and a switch control circuit responsive to the bandwidth adjustment signal to temporarily open or close at least one switch to modify the bandwidth of the continuous time filter circuit to reduce a settling time of a transition of the analog output voltage produced in response to the most recent digital number.

* * * * *